(12) United States Patent
Van Der Stam et al.

(10) Patent No.: US 9,312,178 B2
(45) Date of Patent: Apr. 12, 2016

(54) METHOD OF DICING THIN SEMICONDUCTOR SUBSTRATES

(71) Applicant: ASM Technology Singapore Pte Ltd, Singapore (SG)

(72) Inventors: Karel Maykel Richard Van Der Stam, Apeldoorn (NL); Guido Martinus Henricus Knippels, Schijndel (NL); Mark Christian Mueller, Bietigheim-Bissingen (DE); Juergen Roland Betz, Bad Kreuznach (DE)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/749,920

(22) Filed: Jun. 25, 2015

(65) Prior Publication Data

US 2016/0013105 A1  Jan. 14, 2016

(30) Foreign Application Priority Data

Jul. 14, 2014  (EP) .................................... 14002412

(51) Int. Cl.
| | |
|---|---|
| B23K 26/00 | (2014.01) |
| B29C 35/08 | (2006.01) |
| H01L 21/00 | (2006.01) |
| H01L 21/78 | (2006.01) |
| H01L 21/268 | (2006.01) |
| B23K 26/36 | (2014.01) |
| B23K 26/073 | (2006.01) |

(52) U.S. Cl.
CPC .............. *H01L 21/78* (2013.01); *H01L 21/268* (2013.01); *B23K 26/073* (2013.01); *B23K 26/362* (2013.01); *B23K 2201/40* (2013.01)

(58) Field of Classification Search
CPC .. H01L 21/78; B23K 2201/40; B23K 26/073; B23K 26/362
USPC .................................. 438/460–465; 264/400; 219/121.6–121.86
See application file for complete search history.

(56) References Cited

U.S. PATENT DOCUMENTS

| | | | | |
|---|---|---|---|---|
| 2001/0035401 | A1* | 11/2001 | Manor | B23K 26/0604 219/121.72 |
| 2005/0009235 | A1* | 1/2005 | Swenson | B28D 5/0011 438/113 |
| 2011/0244659 | A1* | 10/2011 | Wang | B23K 26/4075 438/463 |
| 2013/0203239 | A1* | 8/2013 | Fadeyev | B23K 26/0057 438/462 |

* cited by examiner

*Primary Examiner* — Karen Kusumakar
(74) *Attorney, Agent, or Firm* — Ostrolenk Faber LLP

(57) ABSTRACT

A method of dicing a plurality of integrated devices included in a semiconductor substrate using laser energy comprises the steps of directing a first laser beam onto a cutting line along the substrate to ablate a portion of the substrate located along the cutting line to be diced, the portion of the substrate that is ablated forming a recast material adjacent to the cutting line of the substrate that has been diced. A second laser beam is directed onto another portion of the substrate adjacent to the cutting line to conduct heat processing of the recast material formed adjacent to the cutting line.

15 Claims, 4 Drawing Sheets

METHOD OF DICING THIN SEMICONDUCTOR SUBSTRATES

FIELD OF THE INVENTION

The invention relates to the cutting or dicing of semiconductor substrates typically in the form of semiconductor wafers, and in particular, to the dicing of thin semiconductor substrates.

BACKGROUND AND PRIOR ART

Semiconductor substrates in the form of wafers are diced to form singulated integrated devices or chips. As such semiconductor substrates become thinner for the production of thin semiconductor dice used in ever-smaller end-products, it has become increasingly challenging to cut thin semiconductor substrates, which are now manufactured in the order of 100 µm thickness or less.

Thin semiconductor substrates can be diced using a mechanical blade saw or by partially dicing a thicker semiconductor substrate with a mechanical blade saw, and then grinding the semiconductor substrate until the semiconductor dice are separated. However, it has been found that applying mechanical force with the saw blade leads to cracks in and/or breakage of the singulated semiconductor dice. The yield loss is typically more than 30% for semiconductor substrates that are of less than 100 µm thickness. This makes it an unattractive process for mass production. On the other hand, the two-step dice-before-grind approach is slow and is also not ideal for mass production.

Besides using mechanical blade saws, conventional laser dicing processes can also be carried out wherein a laser beam is projected onto a surface of the semiconductor substrate. This results in ablation of the material of the semiconductor substrate through melting and evaporation, until the integrated devices are separated.

When using conventional laser dicing to singulate a semiconductor substrate, a relatively high laser energy level is required to reach the point where melting and evaporation of the substrate material starts. A negative side-effect of such high laser intensity is that the heat damages the sides of the singulated integrated device. This heat damage results in significant reduction of die strength in the integrated devices, which is particularly problematic in the case of thin semiconductor substrates. While the die strength could in principle be recovered at least in part in a post-process etching step, the etching process requires aggressive chemicals that might damage active components on the semiconductor die, as well as the carrier (usually an adhesive tape) on which the semiconductor substrate is mounted.

SUMMARY OF THE INVENTION

It is thus an object of the invention to seek to provide a method of dicing thin semiconductor substrates that reduces structural damage to the sides of singulated integrated devices as compared to conventional laser dicing processes, so as to preserve the die strengths of the integrated devices that are singulated thereby.

Accordingly, the invention provides a method of dicing a plurality of integrated devices included in a semiconductor substrate using laser energy, the method comprising the steps of: directing a first laser beam onto a cutting line along the substrate to ablate a portion of the substrate located along the cutting line to be diced, the portion of the substrate that is ablated forming a recast material adjacent to the cutting line of the substrate that has been diced; and directing a second laser beam onto another portion of the substrate adjacent to the cutting line to conduct heat processing of the recast material formed adjacent to the cutting line.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of methods of dicing thin semiconductor substrates in accordance with the invention will now be described with reference to the accompanying drawings, in which.

DETAILED DESCRIPTION OF THE PREFERRED EMBODIMENT OF THE INVENTION

Figure 1:
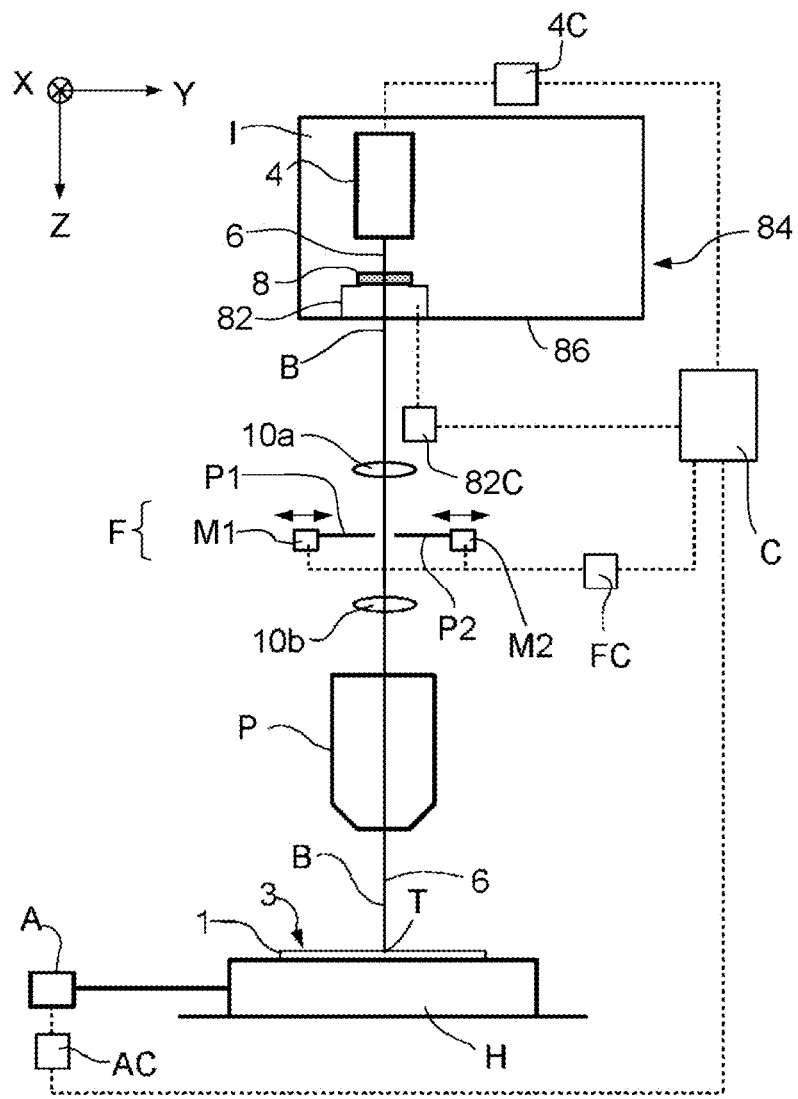
FIG. 1 is a front elevation view of part of a laser dicing apparatus that is applicable for implementing the current invention.

FIG. 1 is a front elevation view of part of a laser dicing apparatus that is applicable for implementing the current invention. The laser dicing apparatus is operable to radiatively dice a substantially planar semiconductor substrate 1 along at least one cutting line on a target surface 3 of the substrate 1 using laser energy.

Specifically, FIG. 1 shows a substrate holder H, which may be in the form of a table or chuck, for supporting the substrate 1 during dicing. An illuminator I is located above the substrate holder H for producing a laser beam output B which may comprise one or more laser beams. A projection system P is located underneath the illuminator I for focusing the laser beam output B onto the target surface 3 of the substrate 1 when it is supported on the substrate holder H. The region of impingement of the laser beam output B upon the substrate 1 is denoted by T. Further, an actuator system A such as a stage assembly causes relative displacement of the substrate holder H with respect to the laser beam output B on a plane that is parallel to an XY plane.

In more detail, the illuminator I further comprises a laser source 4, which may output pulsed laser radiation along an optical axis 6, which is also common to the optical axis 6 of the projection system P. The laser source 4 is connected to a controller 4C that can be used, amongst other functions, to control parameters such as the pulse duration, repetition frequency, and the power or fluence of the said laser radiation. In FIG. 1, control lines or buses are indicated using dashed or broken lines.

A beam splitter 8 patterns the said laser radiation into a laser beam output B comprising one or more laser beams. In this particular example, the beam splitter 8 comprises a Diffractive Optical Element ("DOE") 8 that is mounted on a rotatable table 82, which allows the DOE to be rotated about a vertical Z axis. Such rotation of the rotatable table 82 is controlled by a controller 82C. The DOE may be designed to produce various arrangements of the laser beam output B as desired by a user.

Typically, a substrate 1 that is to undergo dicing will first be mounted on a tape or foil that is attached onto a circumferential frame (not shown), and this composite structure of a substrate 1 mounted on a tape or foil attached to a circumferential frame is then mounted onto the substrate holder H, generally by way of peripheral clamping.

In addition to focusing components of the laser beam output B onto the substrate 1 in a desired configured, the projection system P may also perform other functions such as, for instance, aberration and/or distortion correction.

The laser dicing apparatus illustrated in FIG. 1 additionally shows an adjustable spatial filter F located between the illuminator I and the substrate holder H. This spatial filter F comprises a plurality of motorized plates P1, P2, and the positions of these motorized plates P1, P2 can be adjusted so as to at least partially block selectable laser beam(s) of the laser beam output B and shape the laser beam output B as desired.

The motorized plates P1, P2 are movable back and forth parallel to the Y direction using respective motors M1, M2, which are connected to a controller FC. Another pair of plates (not shown) can similarly be included which is movable back and forth parallel to the X direction using respective motors which are also connected to controller FC.

The various controllers 4C, 82C, AC, FC mentioned above are connected to a master controller C.

As depicted in FIG. 1, the laser beam output B leaving the DOE 8 and entering the projection system P comprises essentially collimated beams. In this particular setup, an intermediate focal plane is created using first and second lenses 10a, 10b, and it is within this plane or closely adjacent to it that the motorized plates P1, P2 are disposed. In this way, the eclipsing edges of the motorized plates P1, P2 are effectively focused onto the target surface 3, together with the laser beam output B.

Figure 2:
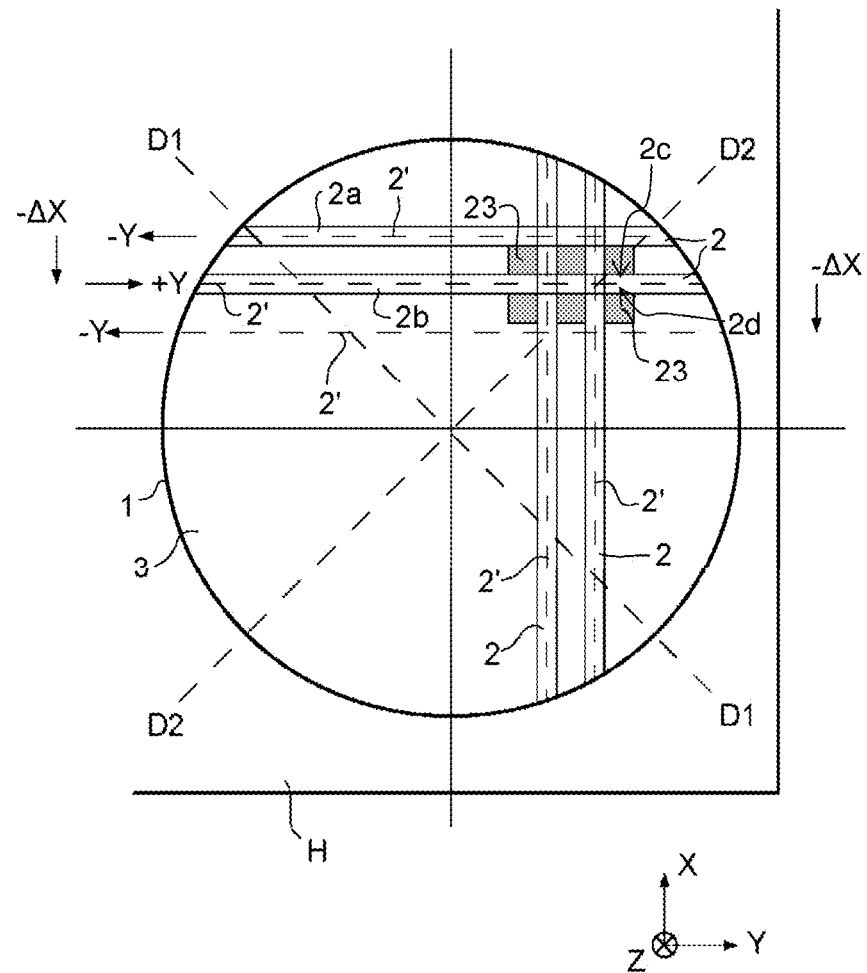
FIG. 2 shows a plan view of a substrate incorporating a plurality of cutting lines that is supported on a substrate holder and illustrates a dicing method according to a first preferred embodiment of the invention.

FIG. 2 shows a plan view of a substrate 1 incorporating a plurality of cutting lines 2 that is supported on a substrate holder H and illustrates a dicing method according to a first preferred embodiment of the invention. Various cutting lines 2 are illustrated on the target surface 3.

These cutting lines 2 run in an X-Y grid pattern on a generally horizontal plane between integrated devices 23 that are distributed in a matrix arrangement on the target surface 3. There will generally be many such integrated devices 23 on a typical semiconductor substrate 1, but only a few have been illustrated here for simplicity and clarity. FIG. 2 depicts a longitudinal scan followed by a lateral step approach to dicing the substrate 1 along multiple, successive cutting lines 2 in a particular direction (in this case ±Y).

The following is an example of a method by which the dicing process may be conducted. The substrate 1 is diced along cutting line 2a by scanning the beam array B in the −Y direction. In practice, such relative motion is achievable by using the actuator system A (see FIG. 1) to scan the substrate holder H in the +Y direction.

After completing a dicing run along cutting line 2a, the actuator system A is actuated to step the substrate holder H in the +X direction by an amount ΔX. As a result, the laser beam output B will effectively be shifted relative to the target surface 3 by an amount −ΔX. The substrate 1 is now diced along cutting line 2b by scanning the beam array B in the +Y direction. In practice, this relative motion is achievable by operating the actuator system A to scan the substrate holder H in the −Y direction.

For reference purposes, FIG. 2 also shows longitudinal, central axes 2' of a number of cutting lines 2. In the apparatus which is schematically depicted in FIG. 2, two separate linear motors (not depicted) are operable to independently drive the substrate holder H along orthogonal D1 and D2 axes, which subtend at angles of 45° with respect to the X and Y axes. As such, motion of the substrate holder H in the X and/or Y axis involves concurrent driving along the D1 and D2 axes.

Typically, the substrate holder H will be caused to float smoothly over a reference surface (such as a polished stone surface) parallel to the XY plane, for instance, with the aid of an air bearing or magnetic bearing (not depicted). The exact position of the substrate holder H can be monitored and controlled with the aid of positioning instruments such as interferometers or linear encoders. Moreover, focus control or level sensing will also typically be employed, to ensure that the target surface 3 of the substrate 1 is maintained at a desired level with respect to the projection system P.

Figure 3A:
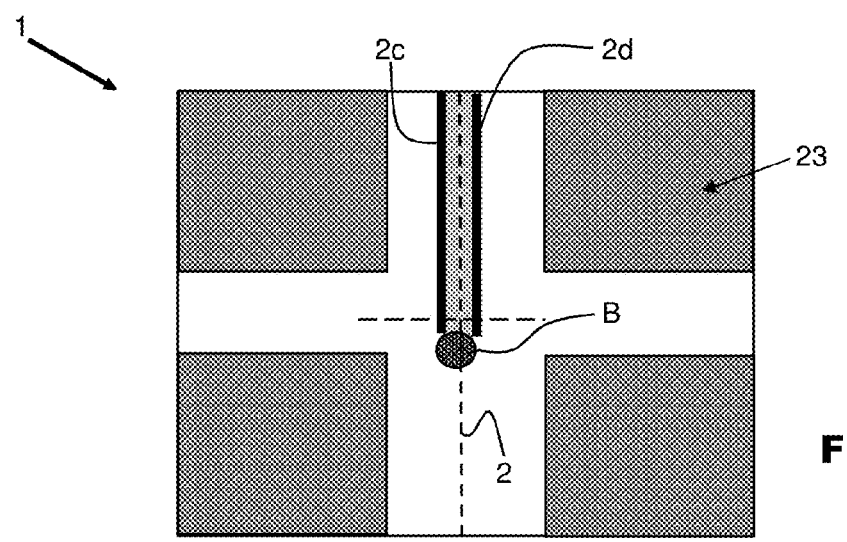
FIGS. 3a and 3b illustrate recast material formed during dicing of a substrate.
Figure 3B:
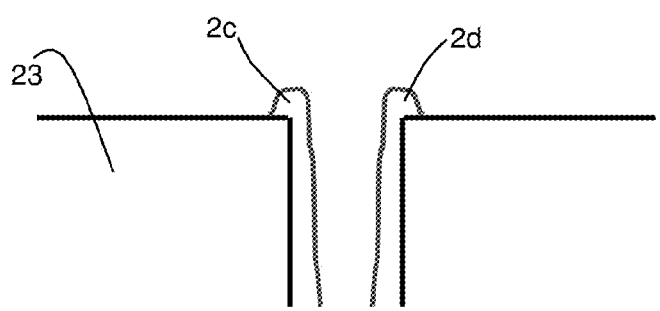

FIGS. 3a and 3b illustrate recast material 2c, 2d formed during dicing of a semiconductor substrate 1. In FIG. 3a, a laser beam output B has diced the substrate 1 along a cutting line 2 of the substrate 1. In FIG. 3b, it can be seen that some of the melted and evaporated substrate material solidify along sidewalls of the integrated devices 23 to form recast material 2c, 2d. Such recast material 2c, 2d should be processed by heat to remove, reduce or weaken it in order to increase the die strength of the integrated devices 23.

For instance, heat processing of the recast material may serve to ablate the recast material and thus reduce it or remove it altogether. Further or alternatively, heat processing of the recast material may melt it again to weaken the recast material and increase the die strength.

According to the first preferred embodiment of the invention herein, upon the completion of a dicing run of the substrate 1 along the cutting line 2, recast material 2c, 2d in the form of melted or evaporated substrate that is formed adjacent to the cutting line 2 will be processed by heating by laser energy. Thus, after dicing along a cutting line 2 with a first laser beam, a second laser beam may thereafter be directed onto each portion of the substrate that includes recast material 2c, 2d formed on the substrate 1 adjacent to the cutting line 2.

In addition, a third laser beam may be directed onto a portion of the substrate 1 adjacent to the cutting line 2 opposite to the side where the second laser beam had been directed, so as to conduct heat processing of the recast material 2c, 2d formed on both sides of the cutting line 2. The first, second and/or third laser beams may be directed onto a portion of the substrate 1 either separately one after the other, or at the same time (by utilizing a DOE) if faster output is desired. It should further be appreciated that the respective first, second and/or third laser beams may be formed from the same laser output source.

When using the same laser output source as the first laser beam for the second and/or third laser beam, it is possible to use the same laser beam to conduct heat processing of the recast layer by applying a defocus of the laser beam. The act of defocusing generally increases the laser spot size and lowers the fluence of the laser beam on the substrate 1. The net effect is that a low-power laser beam B is directed onto the recast region to process it as aforesaid using heat.

Other preferred embodiments of the invention which utilize multiple laser beams directed simultaneously to the cutting line and to the recast material adjacent to the cutting line will now be described.

Figure 4:
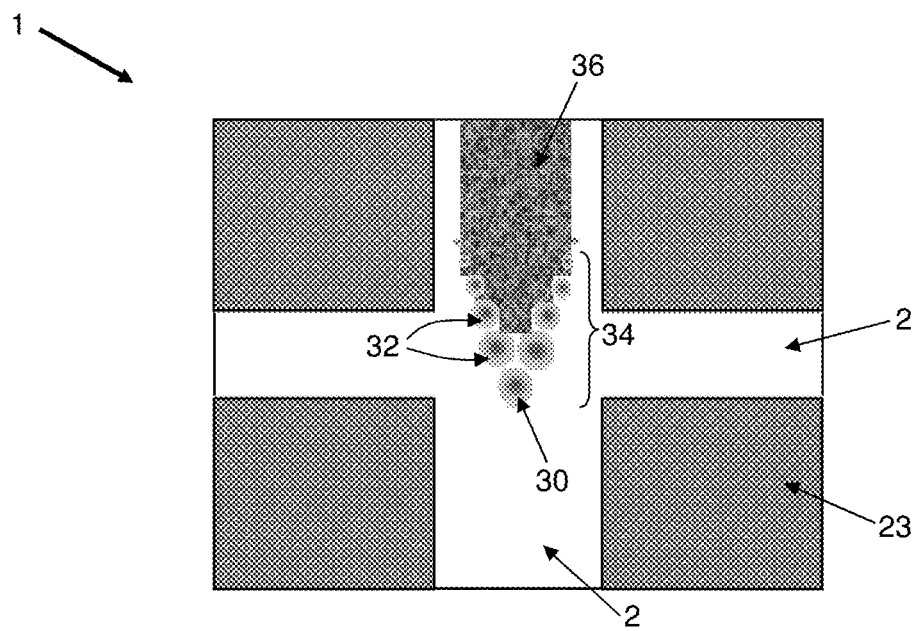
FIG. 4 is a plan view of a semiconductor substrate that is being diced using a dicing method according to a second preferred embodiment of the invention.

FIG. 4 is a plan view of a semiconductor substrate 1 that is being diced using a dicing method according to a second preferred embodiment of the invention. The dicing process is based on a high intensity focused laser beam which creates enough melting and evaporation to separate the integrated devices 23. In order to reduce the effect of heat impact, a special beam configuration is applied wherein inner beam(s) that are directed along the cutting lines 2 are used for dicing and the outer beams further away from the cutting lines 2 are used to conduct heat processing of recast material that is formed during dicing.

It should be noted that for the purpose of illustration, the laser beams 30, 32 are shown with sizes that correspond to their respective energy levels, such that laser beams with higher energy intensities are shown with larger diameters. However, in practice, the multiple laser beams are likely to have substantially similar diameters.

In the illustrated embodiment, a leading beam 30 is centered between several lower intensity trailing beams 32 that trail it. The leading beam 30 contains the highest power and is used to form diced lines 36 along cutting lines 2 of the semiconductor substrate 1. The leading beam 30 and trailing beams 32 may form a V-shaped configuration 34.

Distances between the individual leading and trailing beams 30, 32 in a transverse direction needs to be optimized for the substrate thickness, as this affects an amount of recast material that results. The transverse distance between individual beams perpendicular to the cutting direction can be 0.5 µm to 4.0 µm. The lateral distance between individual beams parallel to the cutting direction must be sufficient to allow the recast material to cool down and solidify. This depends on the energy level of the laser beam(s) used but is generally in the order of 10 to 100 µm. The speed of travel of the positioning table 18 may typically be in the range of 100 mm per second to 500 mm per second. In particular, the parameters should be adjusted to ensure that the recast material 2c, 2d that is melted by a previous laser beam 30, 32 has sufficient time to solidify so that the next laser beam is operative to conduct heat processing on the recast material 2c, 2d.

The suitable number of leading and trailing laser beams 30, 32 applicable to the invention is not fixed, but a typical number of laser beams may be about 11, comprising 1 leading laser beam 30 and 5 trailing laser beams 32 arranged on either side of the leading laser beam 30 along the cutting line 2. In this configuration, an intensity distribution for each set of 5 trailing laser beams on each side of the leading laser beam 30 may be 50%, 30%, 20%, 10% and 5% respectively.

Since the spacing between the individual leading and trailing laser beams 30, 32 in the transverse direction is not necessarily constant, the spot pattern can also form a U-shaped configuration instead of the V-shaped configuration 34 as shown in FIG. 3. At the end of a cutting line 2, the DOE will be rotated by 180° to perform the same process for an adjacent cutting line 2 while the semiconductor substrate 1 is moving in the opposite direction. Alternatively, instead of rotating the DOE, the semiconductor substrate 1 itself may be rotated by rotating the substrate holder H.

Furthermore, it should be appreciated that the leading laser beam 30 may not be the only beam, or a single laser beam, used for dicing the substrate 1. A plurality of similar laser beams with high energy levels positioned along the cutting line 2 may be used to consecutively cut the substrate 1 along the same cutting line 2, especially if a single leading laser beam 30 does not have sufficient energy to dice the substrate 1. In such an implementation, the leading laser beam 30 in the V-shaped configuration 34 may instead comprise a row of leading laser beams arranged along the cutting line 2 to become a Y-shaped configuration.

The above approach is able to achieve a reduced heat impact resulting in less recast, which in turn leads to improved die-strength.

Nevertheless, a possible shortcoming with the above approach is that with a V-shaped configuration 34, it is necessary to rotate the DOE after dicing each cutting line 2 in order to keep the leading beam 30 which primarily dices the semiconductor substrate 1 at the front of the V-shaped configuration 34. Furthermore, when low-K semiconductor substrates are being diced, a trenching step has to be introduced to isolate the integrated devices 23 from the cutting lines 2 to prevent delamination. One solution is to further extend the V-shaped configuration 34 to an X-shaped configuration 38, as illustrated in FIG. 5.

Figure 5:
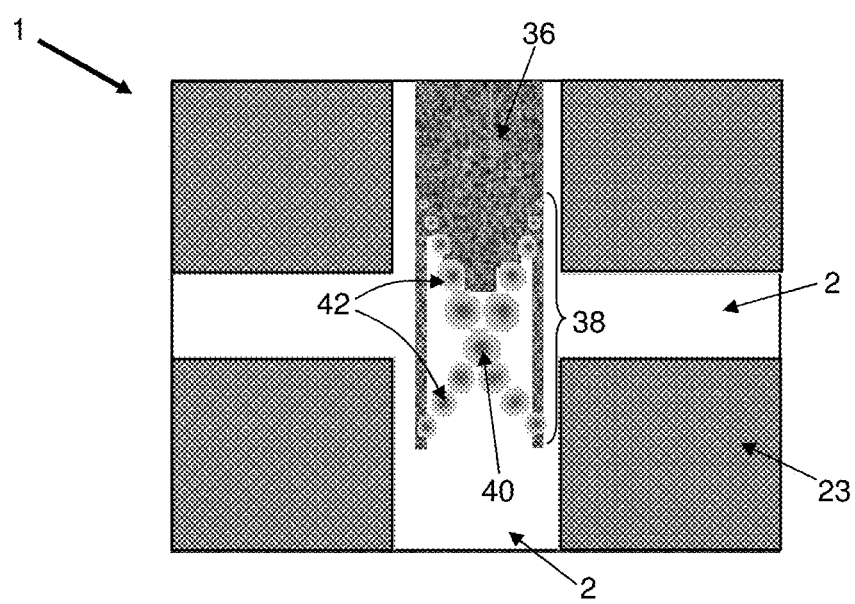
FIG. 5 is a plan view of a semiconductor substrate that is being diced using another dicing method according to a third preferred embodiment of the invention.

FIG. 5 is a plan view of a semiconductor substrate 1 that is being diced using another dicing method according to a third preferred embodiment of the invention. If the available power is sufficient, the V-shaped configuration 34 may be extended to an X-shaped configuration 38, which includes a central beam 40 used primarily for cutting and secondary beams 42 distributed on opposite sides of the central beam 40 along the cutting line 2. In this way, a single pass would not only perform dicing and recast material removal or reduction, but trenching is also performed during the same pass which isolates each integrated device 23 from the cutting line 2. As mentioned above, this is especially important for semiconductor substrates 1 with low-K top layers, where trenching is required to prevent delamination of the top-layers of the semiconductor substrate 1. Furthermore, the "X-shaped" configuration 38 eliminates the need for a rotation mechanism to rotate the DOE.

It should be appreciated that in the dicing methods according to the preferred embodiments of the invention, laser heat processing of recast material is performed after separation of the integrated devices 23. This laser processing reduces, removes or weakens the recast material from the initial cutting leading or central laser beams 30, 40, which serves to also avoid the reduction of die strength. To maintain the process speed, the separation and recast material heat processing steps may be combined in one pass by using the DOE as described herein.

Hence, the die strengths of the singulated integrated devices 23 are increased. There would thus be a corresponding gain in the yield, which avoids the loss of productivity.

The invention described herein is susceptible to variations, modifications and/or additions other than those specifically described and it is to be understood that the invention includes all such variations, modifications and/or additions which fall within the spirit and scope of the above description.

The invention claimed is:

1. Method of dicing a plurality of integrated devices included in a semiconductor substrate using laser energy, the method comprising the steps of:
    directing a first laser beam onto a cutting line along the substrate to ablate a portion of the substrate located along the cutting line to be diced, the portion of the substrate that is ablated forming a recast material adjacent to the cutting line of the substrate that has been diced; and
    directing a second laser beam onto another portion of the substrate adjacent to the cutting line to conduct heat processing of the recast material formed adjacent to the cutting line.

2. The method as claimed in claim 1, wherein the recast material that is formed by the first laser beam is allowed a sufficient time to solidify before the second laser beam is directed to conduct heat processing of it.

3. The method as claimed in claim 1, wherein the second laser beam comprises the first laser beam which has been defocused to decrease its intensity.

4. The method as claimed in claim 1, wherein the first and second laser beams are directed onto the substrate at the same time.

5. The method as claimed in claim 4, wherein the first and second laser beams are arranged to be formed at the same time at different portions of the substrate by a diffractive optical element.

6. The method as claimed in claim 4, wherein the first laser beam is located in front of and leads the second laser beam in a direction in which the first and second laser beams are moving relative to the substrate, and the first laser beam has a higher energy level than the second laser beam.

7. The method as claimed in claim 6, wherein the first laser beam but not the second laser beam is configured to have a sufficient energy level to create enough melting and evaporation to dice the substrate.

8. The method as claimed in claim 4, further comprising the step of directing a third laser beam onto a portion of the substrate adjacent to the cutting line on a side of the cutting line that is opposite to a side where the second laser beam is directed so as to conduct heat processing of recast material formed on both sides of the cutting line.

9. The method as claimed in claim 8, wherein the first, second and third laser beams are directed onto respective portions of the substrate at the same time.

10. The method as claimed in claim 9, wherein the first, second and third laser beams are together arranged in the V-shaped configuration.

11. The method as claimed in claim 9, wherein the first, second and third lasers beams are patterned by a diffractive optical element, and wherein dicing of a second cutting line further comprises the step of rotating the diffractive optical element, and moving the substrate relative to the diffractive optical element in an opposite direction to that moved when dicing along a first cutting line, so as to dice the substrate along the second cutting line.

12. The method as claimed in claim 8, wherein the laser beams comprise more than three laser beams and the plurality of laser beams are arranged with a leading laser beam located in front of multiple trailing laser beams arranged on opposite sides of the cutting line which individually have lower energy levels than the leading laser beam.

13. The method as claimed in claim 8, further comprising additional laser beams which are arranged relative to the first, second and third laser beams to form an X-shaped configuration.

14. The method as claimed in claim 13, wherein an energy level distribution of the laser beam is such that an energy level of a central laser beam located at the cutting line is higher than an energy level of a laser beam located away from the cutting line.

15. The method as claimed in claim 1, further comprising the step of further melting the portion of the substrate located along the cutting line to be diced by directing one or more laser beams onto the cutting line of the substrate in addition to the first laser beam.

\* \* \* \* \*